(12) United States Patent
Aoki

(10) Patent No.: US 6,639,469 B2
(45) Date of Patent: Oct. 28, 2003

(54) VARIABLE-GAIN AMPLIFIER CIRCUIT

(75) Inventor: Yuuichi Aoki, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 10/055,181

(22) Filed: Jan. 23, 2002

(65) Prior Publication Data

US 2002/0130719 A1 Sep. 19, 2002

(30) Foreign Application Priority Data

Jan. 23, 2001 (JP) ........................................ 2001-014273

(51) Int. Cl.[7] ................................................ H03G 3/20
(52) U.S. Cl. ...................................... 330/284; 330/145
(58) Field of Search ................................ 330/144, 145, 330/284, 285; 333/81 R

(56) References Cited

U.S. PATENT DOCUMENTS 3,428,910 A * 2/1969 Webb .......................... 330/145
5,160,898 A * 11/1992 Black .......................... 330/284

FOREIGN PATENT DOCUMENTS

| JP | 06-120756 | 4/1994 |
| JP | 2000-091861 | 3/2000 |
| JP | 2000-151311 | 5/2000 |

* cited by examiner

*Primary Examiner*—Steven J. Mottola
(74) *Attorney, Agent, or Firm*—Hayes Soloway P.C.

(57) ABSTRACT

There is disclosed a variable-gain amplifier circuit comprising an adjustable impedance circuit part including a bipolar transistor having a base connected to a control terminal for receiving a controlled bias voltage, a collector connected to a positive power supply voltage terminal, and an emitter connected to ground through a diode in such a manner that an anode of the diode is connected to the emitter of the transistor and a cathode of the diode is connected to the ground. The variable-gain amplifier circuit further comprises a variable-gain amplifying circuit part having an amplifying circuit having an input coupled through an DC blocking capacitor to an input terminal for receiving an input signal and an output connected to an output terminal. The emitter of the bipolar transistor is connected to a node between the input terminal and the DC blocking capacitor. By controlling the bias voltage applied to the base of the transistor, it is possible to adjust the gain of the whole circuit by action of the adjustable impedance circuit part, and at the same time, it is possible to allow the amplifying circuit having a high S/N ratio, to operate under a low power supply voltage with a low noise factor.

22 Claims, 4 Drawing Sheets

VARIABLE-GAIN AMPLIFIER CIRCUIT

BACKGROUND OF THE INVENTION

The present invention relates to a gain control circuit, which can be used in various parts of a low-noise amplifier used in a transmitter/receiver of mobile radio communication equipment, and which can operate as a variable gain circuit for compensating for the attenuation amount of a radio wave.

In general, in the field of radio communication, the attenuation amount of a radio wave changes with a communication distance. In mobile radio communication equipment such as mobile telephone, since the communication distance greatly changes, it has been required with a variable-gain amplifier circuit in order to compensate for the attenuation amount of the radio wave dependently upon the communication distance.

Referring to FIG. 10, there is shown a block diagram illustrating a fundamental construction of a transmitter/receiver section in a prior art mobile radio communication equipment. The shown transmitter/receiver section includes a receiver circuit part connected between one selection terminal of a switch 102 connected to an antenna 101 and one terminal of a base band processing part 113, the receiver circuit part including a low-noise amplifier 103, a band-pass filter (BP) 104, a mixer 108, an intermediate frequency (IF) amplifier 105, a band pass filter (BP) 106 and a mixer 108, which are cascade-connected in the named order. The shown transmitter/receiver section includes a transmitter circuit part connected between another terminal of the base band processing part 113 and the other selection terminal of the switch 102, the transmitter circuit part including a mixer 109, a band pass filter (BP) 112, a driver amplifier 111 and a power amplifier 110, which are cascade-connected in the named order.

In the above mentioned arrangement, the low-noise amplifier 103 and the intermediate frequency amplifier 105 in the receiver circuit part and the driver amplifier 111 in the transmitter circuit part can be constituted of the above mentioned variable-gain amplifier circuit.

Referring to FIG. 11, there is shown a circuit diagram illustrating a basic construction of the variable-gain amplifier circuit which can be used at various parts in the transmitter/receiver section of the mobile radio communication equipment. The shown variable-gain amplifier circuit is constructed to have a function similar to that of the variable-gain amplifier circuit disclosed in Japanese Patent Application No. Heisei 10-260734 published as JP-A-2000-091861. This variable-gain amplifier circuit includes an adjustable impedance circuit part including an NPN bipolar transistor 8 having a base connected to a control terminal 5 for receiving a controlled bias voltage, a collector connected to a power supply terminal 11 for receiving a positive fixed voltage, and an emitter connected through a resistor 6 to ground. The variable-gain amplifier circuit also includes a variable-gain amplifying circuit part having an amplifying circuit 1 having an input connected through a capacitor 9 to an input terminal 3 for receiving an input signal and an output connected to an output terminal 4, a node between the input terminal 3 and the capacitor 9 being connected to a node between the emitter of the transistor 8 and the resistor 6.

With this arrangement, the power supply terminal 11 connected to the collector of the transistor 8 is connected through a load (not shown) to a constant positive voltage power supply, and the control terminal 5 connected to the base of the transistor 8 is connected to a base bias circuit (not shown) which is formed of for example two bias resistors. In addition, as mentioned above, the emitter of the transistor 8 is connected through the resistor 6 to the ground. Thus, the adjustable impedance circuit part is constituted of the transistor 8 itself and the resistor 6. Since a constant positive voltage is applied to the collector of the transistor through the load from the power supply, the capacitor 9 functions as a DC blocking capacitor against the adjustable impedance circuit part when an amplified signal is outputted from the output terminal 4 of the amplifying circuit 1 in the variable-gain amplifier circuit.

In this variable-gain amplifier circuit, the shunt amount to the ground, of an input signal supplied to the input terminal 3, is controlled by the adjustable impedance circuit part, so that the amplification gain of the amplifying circuit 1 in the variable-gain amplifying circuit part can be varied. More specifically, since the control terminal 5 connected to the base of the transistor 8 is grounded in an AC mode, if the bias voltage applied to the control terminal 5 connected to the base of the transistor 8 is controlled, an impedance between the emitter of the transistor 8 and the ground (impedance of the transistor 8 and the resistor 6) changes, with the result that the shunt amount of the input signal supplied to the input terminal 3 is controlled, and therefore, the amplification gain of the amplifying circuit 1 changes.

As other known technique concerning the gain control circuit and the variable-gain amplifier circuit, a variable-gain amplifier circuit shown in JP-A-6-120756 and a gain control circuit shown in JP-A-2000-151311 are exemplified.

In the above mentioned gain control circuit (variable-gain amplifier circuit), if the resistance value of the resistor 6 connected to the emitter of the transistor in the adjustable impedance circuit part is small, the input signal is bypassed through the resistor directly to the ground, so that a SIN ratio (ratio of signal power to noise power) in the amplifying circuit lowers, with the result that a noise factor (called an "NF") in a maximum gain condition becomes large. To the contrary, if the resistance value of the resistor 6 connected to the emitter of the transistor is large, the power supply voltage required for operating the transistor becomes large. Accordingly, if the resistance value of the resistor 6 is not set at an appropriate value, a stable operation cannot be obtained.

Specifically, in the gain control circuit shown in FIG. 11, assuming that the power supply voltage is 3.0V, a collector current of the transistor 8 in operation is 5.0 mA, a collector-emitter voltage drop of the transistor 8 is 1.0V, a maximum value $Re_{max}$ of the resistor 6 for allowing the transistor 8 to operate is expressed as the following equation (1):

$$Re_{max} = \frac{3.0 - 1.0}{5.0 \times 10^{-3}} = 400 \; \Omega \tag{1}$$

FIG. 12 illustrates a relation of the noise factor NF (dB) to the resistance value Re (ohm) of the resistor 6 in the maximum gain condition of this gain control circuit (resistance dependency of NF). Here, the characteristics of {ONLY RESISTOR} is referred to. For example, if it is desired to suppress the noise factor NF to not greater than 1.2 dB, the resistor is required to have the resistance of not less than 1.2 KΩ, which is apparently larger than 400 Ω as mentioned above. This means that the transistor 8 cannot operate under the power supply voltage of 3.0V.

BRIEF SUMMARY OF THE INVENTION

Accordingly, it is an object of the present invention to provide a gain control circuit which has overcome the above mentioned problems of the prior art.

Another object of the present invention is to provide a gain control circuit allowing a variable-gain amplifier circuit to operate under a low power supply voltage with a lowered noise factor in the maximum gain condition.

A further object of the present invention is to provide a variable-gain amplifier circuit incorporating such a gain control circuit therein.

The above and other objects of the present invention are achieved in accordance with the present invention by a variable-gain amplifier circuit comprising;

- an adjustable impedance circuit part including a bipolar transistor having a base connected to a control terminal for receiving a controlled bias voltage, one of a collector and an emitter of the bipolar transistor being connected to a first power supply terminal, and the other of the collector and the emitter of the bipolar transistor being connected to a second power supply terminal through a diode located in a forward direction to the second power supply terminal; and
- a variable-gain amplifying circuit part having an amplifying circuit having an input coupled to an input terminal for receiving an input signal and an output connected to an output terminal,
- the other of the collector and the emitter of the bipolar transistor connected to the second power supply terminal through the diode being connected through an DC blocking capacitor to the input of the amplifying circuit.

Preferably, the diode is connected in series with a resistor between the other of the collector and the emitter of the bipolar transistor and the second power supply terminal.

In a first embodiment of the variable-gain amplifier circuit, the first power supply terminal is a positive power supply voltage terminal and the second power supply terminal is connected to ground, the collector of the bipolar transistor being connected to the positive power supply voltage terminal, and the emitter of the bipolar transistor being connected to the ground through the diode connected in such a manner that an anode of the diode is connected to the emitter of the transistor and a cathode of the diode is connected to the ground. Furthermore, the input of the amplifying circuit is connected through the DC blocking capacitor to the input terminal, and the emitter of the bipolar transistor is connected to a node between the DC blocking capacitor and the input terminal.

In this first embodiment, a resistor can be connected in series with the diode between the emitter of the bipolar transistor and the ground.

In a second embodiment of the variable-gain amplifier circuit, the first power supply terminal is connected to ground and the second power supply terminal is a positive power supply voltage terminal, the emitter of the bipolar transistor being connected to the ground, and the collector of the bipolar transistor being connected to the positive power supply voltage terminal through the diode connected in such a manner that an anode of the diode is connected to the positive power supply voltage terminal and a cathode of the diode is connected to the collector of the bipolar transistor. Furthermore, the input of the amplifying circuit is connected through the DC blocking capacitor to the input terminal, and the collector of the bipolar transistor is connected to a node between the DC blocking capacitor and the input terminal.

In this second embodiment, a resistor can be connected in series with the diode between the collector of the bipolar transistor and the positive power supply voltage terminal.

In a third embodiment of the variable-gain amplifier circuit, the first power supply terminal is a positive power supply voltage terminal and the second power supply terminal is ground, the collector of the bipolar transistor being connected to the positive power supply voltage terminal, and the emitter of the bipolar transistor being connected to the ground through the diode connected in such a manner that an anode of the diode is connected to the emitter of the transistor and a cathode of the diode is connected to the ground. Furthermore, the input of the amplifying circuit is connected directly to the input terminal, and the emitter of the bipolar transistor is connected through the DC blocking capacitor to the input of the amplifying circuit.

In this third embodiment, a resistor can be connected in series with the diode between the emitter of the bipolar transistor and the ground.

In a fourth embodiment of the variable-gain amplifier circuit, the first power supply terminal is connected to ground and the second power supply terminal is a positive power supply voltage terminal, the emitter of the bipolar transistor being connected to the ground, and the collector of the bipolar transistor being connected to the positive power supply voltage terminal through the diode connected in such a manner that an anode of the diode is connected to the positive power supply voltage terminal and a cathode of the diode is connected to the collector of the bipolar transistor. Furthermore, the input of the amplifying circuit is connected directly to the input terminal, and the collector of the bipolar transistor is connected through the DC blocking capacitor to the input of the amplifying circuit.

In this fourth embodiment, a resistor can be connected in series with the diode between the collector of the bipolar transistor and the positive power supply voltage terminal.

The above and other objects, features and advantages of the present invention will be apparent from the following description of preferred embodiments of the invention with reference to the accompanying drawings.

DETAILED DESCRIPTION OF THE INVENTION

Figure 1:
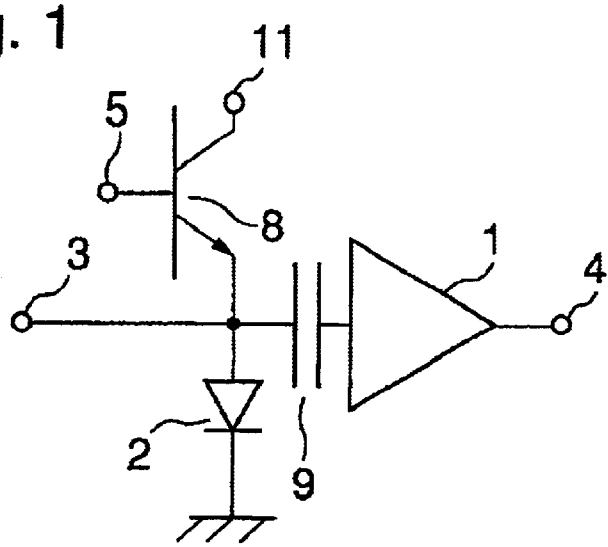
FIG. 1 is a circuit diagram of the variable-gain amplifier circuit incorporating therein a first embodiment of the gain control circuit in accordance with the present invention.

Referring to FIG. 1, there is shown a circuit diagram of the variable-gain amplifier circuit incorporating therein a first embodiment of the gain control circuit in accordance with the present invention. In FIG. 1 and the succeeding figures, elements corresponding to those shown in FIG. 11 are given the same Reference Numbers.

The shown circuit includes an adjustable impedance circuit part including an NPN bipolar transistor 8 having a base connected to a control terminal 5 for receiving a controlled bias voltage, a collector connected to a power supply terminal 11 for receiving a positive fixed voltage, and an emitter connected to ground through a diode 2 connected in a forward direction to the ground. The shown circuit also includes a variable-gain amplifying circuit part having an amplifying circuit 1 having an input connected through a capacitor 9 to an input terminal 3 for receiving an input signal and an output connected to an output terminal 4. A node between the input terminal 3 and the capacitor 9 is connected to a node between the emitter of the transistor 8 and the diode 2. Since the diode 2 is connected in the forward direction to the ground, an anode of the diode 2 is connected to the emitter of the transistor 8, and a cathode of the diode 2 is connected to the ground.

Figure 11:
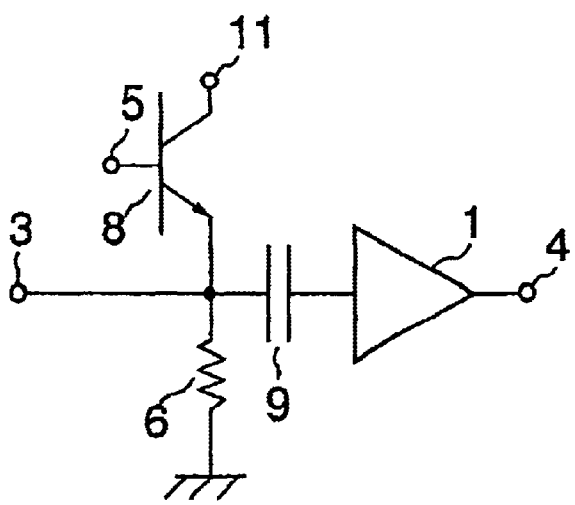
FIG. 11 is a circuit diagram illustrating a basic construction of the variable-gain amplifier circuit which can be used at various parts in the transmitter/receiver section of the mobile radio communication equipment shown in FIG. 10.

As seen from comparison between FIG. 1 and FIG. 11, the shown circuit is featured in that the diode 2 is provided in place of the resistor 6 in the adjustable impedance circuit part. Therefore, input and output terminals of the shown circuit are connected to peripheral circuits and devices (not shown), similarly to the circuit shown in FIG. 11.

With his arrangement, the power supply terminal 11 connected to the collector of the transistor 8 is connected through a load (not shown) to a constant positive voltage power supply, and the control terminal 5 connected to the base of the transistor 8 is connected to a base bias circuit (not shown) which is formed of for example two bias resistors. In addition, as mentioned above, the emitter of the transistor 8 is connected through the diode 2 to the ground. Thus, the adjustable impedance circuit part is constituted of the transistor 8 itself and the diode 2. Since a constant positive voltage is applied to the collector of the transistor through the load from the power supply, the capacitor 9 functions as a DC blocking capacitor against the adjustable impedance circuit part when an amplified signal is outputted from the output terminal 4 of the amplifying circuit 1 in the variable-gain amplifier circuit.

Also in this variable-gain amplifier circuit, the shunt amount to the ground, of an input signal supplied to the input terminal 3, is controlled by the adjustable impedance circuit part, so that the amplification gain of the amplifying circuit 1 in the variable-gain amplifying circuit part can be varied. More specifically, since the control terminal 5 connected to the base of the transistor 8 is grounded in an AC mode, if the bias voltage applied to the control terminal 5 connected to the base of the transistor 8 is controlled, an impedance between the emitter of the transistor 8 and the ground changes because the impedance changes in accordance with the amount of currents flowing through the transistor 8 and through the diode 2, with the result that the shunt amount of the input signal supplied to the input terminal 3 is controlled, and therefore, the amplification gain of the amplifying circuit 1 changes.

Now, an operation in this gain control circuit will be explained.

A relation expressed in the following equation (2) holds among an impedance $Z_D$, a differential conductance $g_D$ and a capacitance Cj of the diode 2.

$$\frac{1}{Z_D} = g_D + j\omega C_j \quad (2)$$

Here, when a diffusion capacitance is sufficiently smaller than a junction capacitance, the differential conductance $g_D$ and the capacitance Cj can be expressed as the following equations (3) and (4), respectively.

$$g_D = \frac{q}{KT} \cdot I_F = g_0(e^{a_0 \cdot V_D} - 1) \quad (V_D \geq 0) \quad (3)$$

$$Cj = \left(\frac{C}{\phi_D - V_D}\right)^{\frac{1}{n}} \quad (V_D \geq \phi_D) \quad (4)$$

where q is electric charge amount of electron k is Boltzmann's constant

T is absolute temperature $I_F$ is a forward DC current of the diode 2

$g_0$ and $a_0$ are constant $\phi_D$ is built-in potential n is constant which ordinarily takes the value of 2 to 3

C is coefficient of the junction capacitance and becomes very small by reducing the area of the diode 2

$V_D$ is forward voltage applied to the diode 2

Incidentally, if the forward voltage $V_D$ applied to the diode 2 is negative, the differential conductance $g_D$ becomes zero, and if the forward voltage $V_D$ applied to the diode 2 is positive, the differential conductance $g_D$ becomes large in proportion to the forward DC current $I_F$. In addition, the capacitance Cj is a capacitance created by a depletion layer generated in a p-n junction, and becomes infinite when the forward voltage $V_D$ reaches the built-in potential $\phi_D$.

Figure 2:
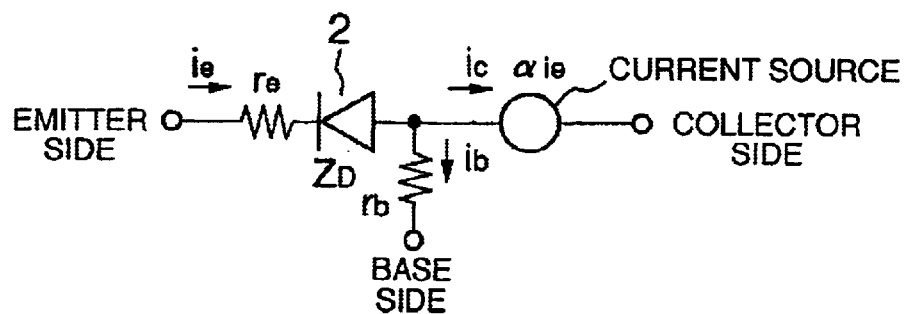
FIG. 2 is an AC equivalent circuit of an adjustable impedance circuit part in the gain control circuit shown in FIG. 1.

Referring to FIG. 2, there is shown an AC equivalent circuit of the adjustable impedance circuit part in the gain control circuit shown in FIG. 1. This AC equivalent circuit includes the transistor 8, the diode 2 and a current source. The impedance $Z_D$ of the diode 2 between a base side and an emitter side in the transistor 8 corresponds to the impedance $Z_D$ expressed in the above equation (2). Beside, a parasite resistance in the emitter side of the transistor 8 is expressed by $r_e$, and a parasite resistance in the base side of the transistor 8 is expressed by $r_b$. A transport factor in the current source is expressed as α. In this case, the impedance $Z_i$ viewed from the emitter of the transistor 8 is expressed by the following equation (5):

$$Z_i = \frac{v_1}{i_e} \quad (5)$$

where $V_1$ is expressed by the following equation (5):

$$v_1 = \frac{r_e + Z_D}{i_e} + r_b + i_b \quad (6)$$

In addition, the following relation (7) holds in the transistor 8.

$$i_b = i_e - i_c = (1-\alpha)\cdot i_e \quad (7)$$

Accordingly, the impedance $Z_i$ is expressed as follows:

$$Z_i = r_e + Z_D + (1-\alpha)\cdot r_b \quad (8)$$

In conclusion, the impedance $Z_i$ viewed from the emitter of the transistor 8 assumes the following maximum value when a voltage between the base side and the emitter side is 0 (zero).

$$r_e + \left(\frac{\phi_D}{C}\right)^{\frac{1}{n}} + (1-\alpha)\cdot r_b$$

As mentioned above, the maximum value is very large, but the larger the voltage between the base side and the emitter side is, the impedance approaches 0 (zero).

Applying this to the gain control circuit shown in FIG. 1, if the controlled bias voltage applied to the control terminal 5 is increased, the voltage between the base side and the emitter side in the transistor 8 becomes large, so that the impedance $Z_i$ of the transistor 8 viewed from the emitter of the transistor 8 becomes small, with the result that the input signal applied to the input terminal 3 is shunted. In addition, since the collector current of the transistor 8 flows into the diode 2, the impedance $Z_D$ of the diode 2 lowers in accordance with the equation (2), so that the input signal is also shunted into the diode 2. As a result, the gain of the whole circuit lowers.

To the contrary, if the bias voltage applied to the control terminal 5 is decreased, both the impedance $Z_i$ of the transistor 8 viewed from the emitter and the impedance $Z_D$ of the diode 2 become large, with the result that the proportion of the input signal actually applied to the amplifying circuit 1 is increased, so that the gain of the whole circuit elevates. Furthermore, when the bias voltage applied to the control terminal 5 is made smaller than a voltage obtained by adding an on-voltage of the diode 2 to an on-voltage between the base and the emitter of the transistor 8, the respective impedances become extremely large, and therefore, all of the input signal is supplied to the amplifying circuit 1. Accordingly, the gain increases. At this time, the S/N ratio of the whole circuit becomes large so that the noise factor NF becomes small.

Figure 3:
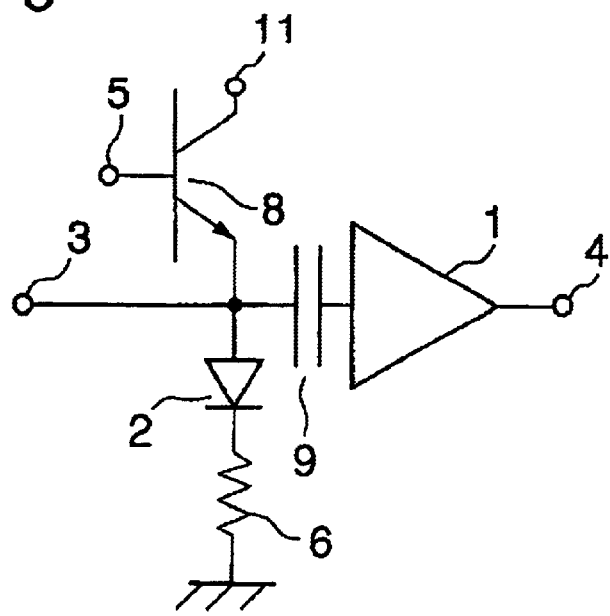
FIG. 3 is a circuit diagram of a modification of the first embodiment shown in FIG. 1.

Referring to FIG. 3, there is shown a circuit diagram of a modification of the first embodiment shown in FIG. 1. This modification is different from the first embodiment shown in FIG. 1 only in that a resistor 6 is inserted between the cathode of the diode 2 and the ground.

Figure 12:
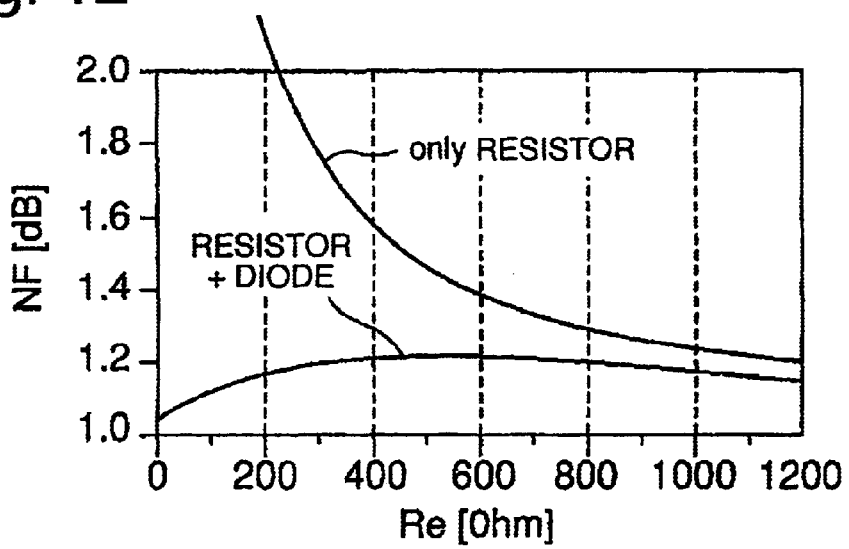
FIG. 12 is a graph illustrating a relation of the noise factor NF (dB) to the resistance value Re (ohm) of the resistor in the maximum gain condition of the gain control circuits shown in FIGS. 3 and 11.

In this circuit, assuming that the power supply voltage is 3.0V, a collector current of the transistor 8 in operation is 5.0 mA, a collector-emitter voltage drop of the transistor 8 is 1.0V, when the transistor 8 is off, the diode 2 is also off, so that a very high impedance is realized. Therefore, even if the value of the resistor 6 is small, the value of the noise factor NF becomes sufficiently small, as shown by the characteristics of {RESISTOR+DIODE} in FIG. 12. In addition, assuming that the voltage drop of the diode 2 in the on condition is 1.4V and the collector-emitter voltage drop of the transistor 8 is 1.0V, if the value of the resistor 6 is made small, the circuit can operate under the power supply voltage of not less than 2.4V.

Incidentally, it would be apparent to persons skilled in the art that similar effect and advantage can be obtained even if the diode 2 and the resistor 6 is exchanged in position so that the resistor 6 is connected between the emitter of the transistor 8 and the anode of the diode 2.

Figure 4:
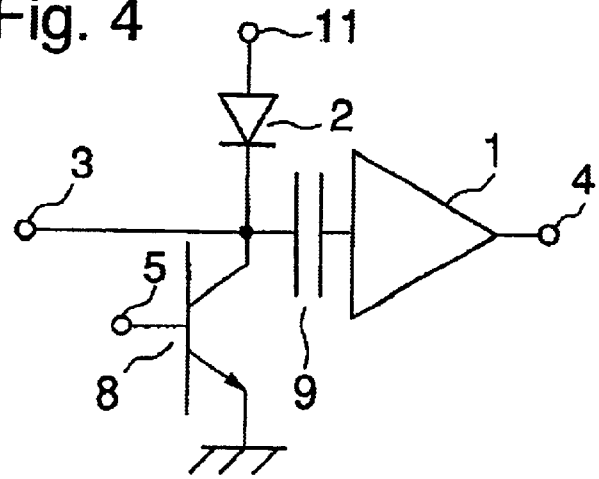
FIG. 4 is a circuit diagram of the variable-gain amplifier circuit incorporating therein a second embodiment of the gain control circuit in accordance with the present invention.

The fundamental operation of the above mentioned gain control circuit can be obtained even if the place of the diode 2 and the resistor 6 in relation to the transistor 8 and the position of the DC blocking capacitor 9 are changed as follows:

Referring to FIG. 4, there is shown a circuit diagram of the variable-gain amplifier circuit incorporating therein a second embodiment of the gain control circuit in accordance with the present invention.

The circuit shown in FIG. 4 includes an adjustable impedance circuit part including a bipolar transistor 8 having a base connected to a control terminal 5 for receiving a controlled bias voltage, a collector connected to a positive power supply terminal 11 through a diode 2 connected in a forward direction to the positive power supply terminal 11, and an emitter connected directly to ground. The power supply terminal 11 is connected for receiving a fixed positive power supply voltage. The shown circuit also includes a variable-gain amplifying circuit part having an amplifying circuit 1 having an input connected through a capacitor 9 to an input terminal 3 for receiving an input signal and an output connected to an output terminal 4. A node between the input terminal 3 and the capacitor 9 is connected to a node between the collector of the transistor 8 and the diode 2. Since the diode 2 is connected in the forward direction to the positive power supply terminal 11, an anode of the diode 2 is connected to the positive power supply terminal 11, and a cathode of the diode 2 is connected to the collector of the transistor 8.

Figure 5:
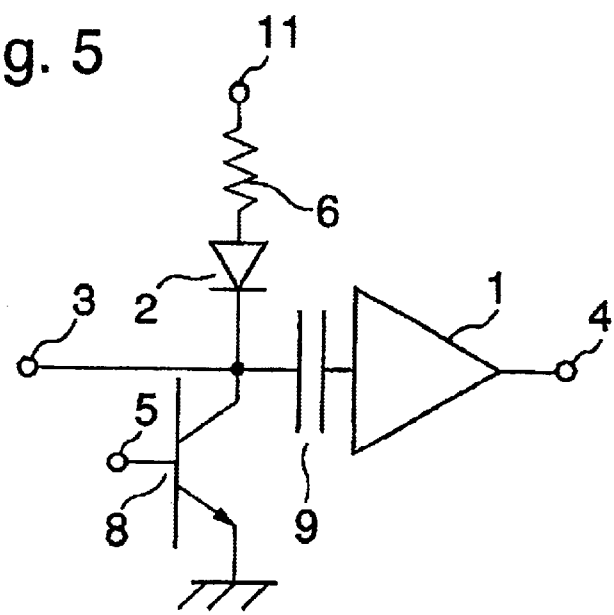
FIG. 5 is a circuit diagram of a modification of the second embodiment shown in FIG. 4.

Referring to FIG. 5, there is shown a circuit diagram of a modification of the second embodiment shown in FIG. 4. This modification is different from the second embodiment shown in FIG. 4 only in that a resistor 6 is added between the anode of the diode 2 and the power supply terminal 11. In this connection, it would be apparent to persons skilled in the art that the diode 2 and the resistor 6 can be exchanged in position so that the resistor 6 is connected between the collector of the transistor 8 and the cathode of the diode 2.

Figure 6:
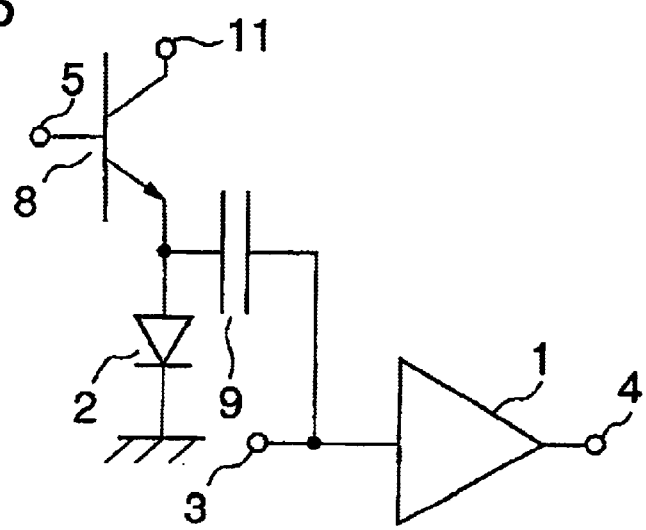
FIG. 6 is a circuit diagram of the variable-gain amplifier circuit incorporating therein a third embodiment of the gain control circuit in accordance with the present invention.

Referring to FIG. 6, there is shown a circuit diagram of the variable-gain amplifier circuit incorporating therein a third embodiment of the gain control circuit in accordance with the present invention.

The circuit shown in FIG. 6 includes an adjustable impedance circuit part including a bipolar transistor 8 having a base connected to a control terminal 5 for receiving a controlled bias voltage, a collector connected to a power supply terminal 11 for receiving a fixed positive voltage, and an emitter connected to ground through a diode 2 connected in a forward direction to the ground. The shown circuit also includes a variable-gain amplifying circuit part having an amplifying circuit 1 having an input connected directly to an input terminal 3 for receiving an input signal and an output connected to an output terminal 4. The input of the amplifying circuit 1 is connected through a capacitor 9 to a node between the emitter of the transistor 8 and the diode 2. Since the diode 2 is connected in the forward direction to the ground, an anode of the diode 2 is connected to the emitter of the transistor 8, and a cathode of the diode 2 is connected to the ground.

Figure 7:
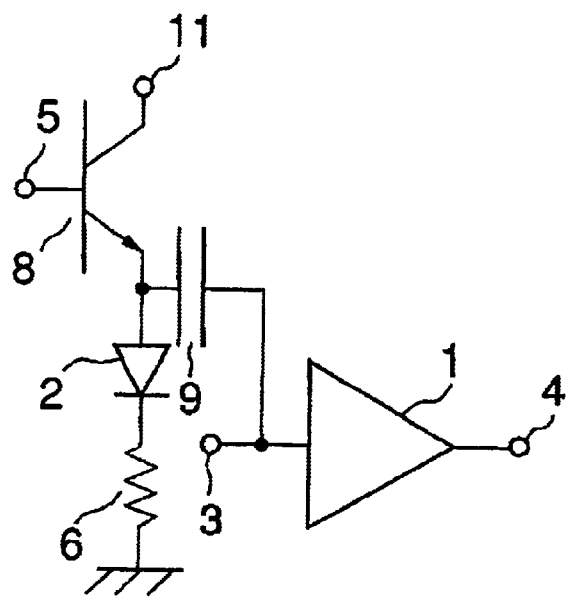
FIG. 7 is a circuit diagram of a modification of the third embodiment shown in FIG. 6.

Referring to FIG. 7, there is shown a circuit diagram of a modification of the third embodiment shown in FIG. 6. This modification is different from the third embodiment shown in FIG. 6 only in that a resistor 6 is added between the cathode of the diode 2 and the ground. In this connection, it would be apparent to persons skilled in the art that the diode 2 and the resistor 6 can be exchanged in position so that the resistor 6 is connected between the emitter of the transistor 8 and the anode of the diode 2.

Figure 8:
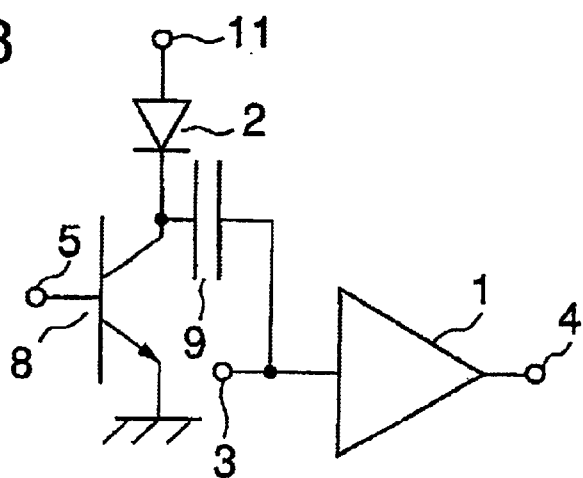
FIG. 8 is a circuit diagram of the variable-gain amplifier circuit incorporating therein a fourth embodiment of the gain control circuit in accordance with the present invention.

Referring to FIG. 8, there is shown a circuit diagram of the variable-gain amplifier circuit incorporating therein a fourth embodiment of the gain control circuit in accordance with the present invention.

The circuit shown in FIG. 8 includes an adjustable impedance circuit part including a bipolar transistor 8 having a base connected to a control terminal 5 for receiving a controlled bias voltage, a collector connected to a positive power supply terminal 11 through a diode 2 connected in a forward direction to the positive power supply terminal 11, and an emitter connected directly to ground. The positive power supply terminal 11 is connected for receiving a fixed positive power supply voltage. The shown circuit also includes a variable-gain amplifying circuit part having an amplifying circuit 1 having an input connected directly to an input terminal 3 for receiving an input signal and an output connected to an output terminal 4. The input of the amplifying circuit 1 is connected through a capacitor 9 to a node between the collector of the transistor 8 and the diode 2. Since the diode 2 is connected in the forward direction to the positive power supply terminal 11, an anode of the diode 2 is connected to the positive power supply terminal 11, and a cathode of the diode 2 is connected to the collector of the transistor 8.

Figure 9:
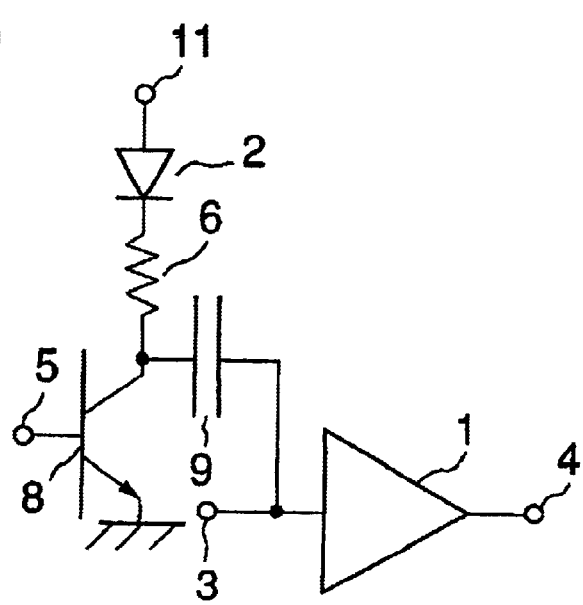
FIG. 9 is a circuit diagram of a modification of the fourth embodiment shown in FIG. 8.
Figure 10:
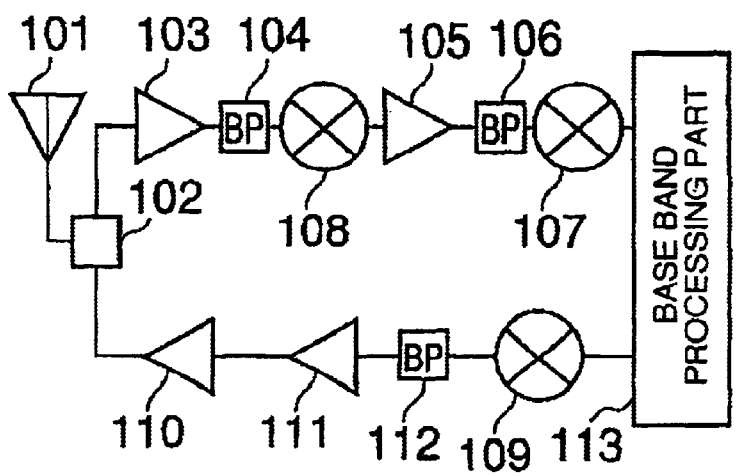
FIG. 10 is a block diagram illustrating a fundamental construction of a transmitter/receiver section in a prior art mobile radio communication equipment.

Referring to FIG. 9, there is shown a circuit diagram of a modification of the fourth embodiment shown in FIG. 8. This modification is different from the fourth embodiment shown in FIG. 8 only in that a resistor 6 is added between the cathode of the diode 2 and the collector of the transistor 8. In this connection, it would be apparent to persons skilled in the art that the diode 2 and the resistor 6 can be exchanged in position so that the resistor 6 is connected between the anode of the diode 2 and the positive power supply terminal 11.

Of the above mentioned embodiments, the gain control circuit shown in FIG. 4 and the gain control circuit shown in FIG. 8 operate similarly to each other. In these gain control circuits, the cathode of the diode 2 is connected to the collector of the transistor 8, and the anode of the diode 2 is connected to the positive power supply terminal 11 for receiving a fixed positive voltage. The emitter of the transistor 8 is connected directly to the ground. The control terminal 5 connected to the base of the transistor 8 is connected to the ground in an AC mode. The collector of the transistor 8 is connected through the capacitor 9 is connected to the input of the amplifying circuit 1. By controlling the bias voltage at the control terminal 5 to change the current amount flowing through the diode 2, the impedance of the diode 2 changes, with the result that the shunt amount of the input signal supplied to the input terminal 3 is controlled, and therefore, the amplification gain of the amplifying circuit 1 changes.

More specifically, if the bias voltage applied to the control terminal 5 is increased, the current amount flowing through the transistor 8 increases, so that the current amount flowing through the diode 2 correspondingly increases, with the result that the impedance $Z_D$ of the diode 2 lowers in accordance with the equation (2), so that the input signal is bypassed to the power supply terminal 11. As a result, the gain of the whole circuit lowers To the contrary, if the bias voltage applied to the control terminal 5 is decreased, the transistor 8 approaches the off condition, so that the current amount flowing through the diode 2 correspondingly decreases, so that the impedance $Z_D$ of the diode 2 becomes large, with the result that the proportion of the input signal actually applied to the amplifying circuit 1 is increased, so that the gain of the whole circuit elevates. Furthermore, when the bias voltage applied to the control terminal is made smaller than an on-voltage between the base and the emitter of the transistor 8, the current no longer flows through the diode 2, so that the impedance becomes very large, and therefore, all of the input signal is supplied to the amplifying circuit 1. Accordingly, the gain increases. At this time, the S/N ratio of the whole circuit becomes large so that the noise factor NF becomes small.

The gain control circuit shown in FIG. 5 and the gain control circuit shown in FIG. 9 operate similarly to each other. In the gain control circuit shown in FIG. 5, the cathode of the diode 2 is connected directly to the collector of the transistor 8, and on the other hand, in the gain control circuit shown in FIG. 9, the cathode of the diode 2 is connected through the resistor 6 to the collector of the transistor 8. In the gain control circuit shown in FIG. 5, the anode of the diode 2 is connected through the resistor 6 to the power supply terminal 11 connected to the constant voltage power supply, and on the other hand, in the gain control circuit shown in FIG. 9, the anode of the diode 2 is connected directly to the power supply terminal 11 connected to the constant voltage power supply. However, in both the gain control circuits shown in FIGS. 5 and 9, the emitter of the transistor 8 is connected directly to the ground, and the control terminal 5 connected to the base of the transistor 8 is connected to the ground in an AC mode. Furthermore, the collector of the transistor 8 is connected through the capacitor 9 is connected to the input of the amplifying circuit 1. By controlling the bias voltage at the control terminal 5 to change the current amount flowing through the diode 2, the impedance of the diode 2 changes, with the result that the shunt amount of the input signal supplied to the input terminal 3 is controlled, and therefore, the amplification gain of the amplifying circuit 1 changes.

In these gain control circuits, therefore, if the bias voltage at the control terminal 5 is decreased, it is possible to adjust the variable gain of the whole circuit so as to elevate the gain and to lower the noise factor NF while maintaining the SIN ratio of the whole circuit at a high level.

The gain control circuit shown in FIG. 6 is a variation of the gain control circuit shown in FIG. 1 obtained by changing the position of the DC blocking capacitor 9. Therefore, the operation of the gain control circuit shown in FIG. 6 is fundamentally the same as that of the gain control circuit shown in FIG. 1.

The gain control circuit shown in FIG. 7 operates similarly to the gain control circuit shown in FIG. 3. In both the gain control circuits shown in FIGS. 3 and 7, the anode of the diode 2 is connected to the emitter of the transistor 8, and the cathode of the diode 2 is connected through the resistor 6 to the ground. The collector of the transistor 8 is connected to the power supply terminal 11 connected to the constant voltage power supply, and the control terminal 5 connected to the base of the transistor 8 is connected to the ground in an AC mode. Furthermore, the emitter of the transistor 8 is connected through the capacitor 9 is connected to the input of the amplifying circuit 1. By controlling the bias voltage at the control terminal 5 to change the current amounts flowing through the transistor 8 and through the diode 2, the impedance of the transistor 8 and the diode 2 changes, with the result that the shunt amount of the input signal supplied to the input terminal 3 is controlled, and therefore, the amplification gain of the amplifying circuit 1 changes.

In these gain control circuits, therefore, if the bias voltage at the control terminal 5 is decreased, it is possible to adjust the variable gain of the whole circuit so as to elevate the gain and to lower the noise factor NF while maintaining the S/N ratio of the whole circuit at a high level.

In conclusion, in each of the above mentioned embodiments and modifications of the gain control circuit, the adjustable impedance circuit part is characterized by connecting the diode 2 which has a substantially constant voltage drop when the diode 2 is in an on condition, in series to either the emitter or the collector of the transistor 8 which assumes a high impedance when the transistor 8 is off. Therefore, when the bias voltage at the control terminal 5 connected to the base of the transistor 8 is decreased to adjust the variable gain of the whole circuit by action of the adjustable impedance circuit part, it is possible to allow the amplifying circuit 1 in the variable-gain amplifying circuit part having a high S/N ratio, to operate under a low power supply voltage with a low noise factor.

Incidentally, in the above mentioned embodiments and modifications, it has been described that the collector-emitter voltage drop of the transistor 8 is 1.0V and the base-emitter voltage drop is 1.4V, which are typical values in silicon bipolar transistors. However, even if the bipolar transistor 8 has different voltage drops, if the total value obtained by adding the voltage drop of the diode 2 to the collector-emitter voltage drop of the transistor 8 is smaller than the power supply voltage, the circuit is operable.

In addition, it has been described that the transistor 8 is an NPN transistor, however, it would be apparent to persons skilled in the art that the transistor 8 can be constituted of a PNP transistor in place of the NPN transistor. In this case, an emitter of the PNP transistor is connected to a position to which the collector of the NPN transistor was connected, and a collector of the PNP transistor is connected to a position to which the emitter of the NPN transistor was connected. A base of the PNP transistor is connected to a position to which the base of the NPN transistor was connected.

The invention has thus been shown and described with reference to the specific embodiments. However, it should be noted that the present invention is in no way limited to the details of the illustrated structures but changes and modifications may be made within the scope of the appended claims.

What is claimed is:

1. A variable-gain amplifier circuit comprising:
    an adjustable impedance circuit part including a bipolar transistor having a base connected to a control terminal for receiving a controlled bias voltage, one of a collector and an emitter of said bipolar transistor being connected to a first power supply terminal, and the other of said collector and said emitter of said bipolar transistor being connected to a second power supply terminal through a diode located in a forward direction to said second power supply terminal; and
    a variable-gain amplifying circuit part having an amplifying circuit having an input coupled to an input terminal for receiving an input signal and an output connected to an output terminal,
    wherein a connection point between said bipolar transistor and said diode is connected through a DC blocking capacitor to said input of said amplifying circuit, and
    wherein the diode is located in a forward direction when an anode of the diode assumes a higher potential than the cathode.

2. A variable-gain amplifier circuit claimed in claim 1 wherein a resistor is connected in series with said diode between the other of said collector and said emitter of said bipolar transistor and said second power supply terminal.

3. A variable-gain amplifier circuit comprising:
    an adjustable impedance circuit part including a bipolar transistor having a base connected to a control terminal for receiving a controlled bias voltage, one of a collector and an emitter of said bipolar transistor being connected to a first power supply terminal, and the other of said collector and said emitter of said bipolar transistor being connected to a second power supply terminal through a diode located to said second power supply terminal, and
    a variable-gain amplifying circuit part having an amplifying circuit having an input coupled to an input terminal for receiving an input signal and an output connected to an output terminal,
    the other of said collector and said emitter of said bipolar transistor connected to said second power supply terminal through said diode and being connected through a DC blocking capacitor to said input of said amplifying circuit,
    wherein said first power supply terminal is a positive power supply voltage terminal and said second power supply terminal is connected to ground, said collector of said bipolar transistor being connected to said positive power supply voltage terminal, and said emitter of said bipolar transistor being connected to said ground through said diode connected in such a manner that an anode of said diode is connected to said emitter of said transistor and a cathode of said diode is connected to said ground, and wherein said input of said amplifying circuit is connected through said DC blocking capacitor to said input terminal, and said emitter of said bipolar transistor is connected to a node between said DC blocking capacitor and said input terminal, and
    wherein the diode is located in a forward direction when an anode of the diode assumes a higher potential than the cathode.

4. A variable-gain amplifier circuit claimed in claim 3 wherein a resistor is connected in series with said diode between said emitter of said bipolar transistor and said ground.

5. A variable-gain amplifier circuit comprising:
    an adjustable impedance circuit part including a bipolar transistor having a base connected to a control terminal for receiving a controlled bias voltage, one of a collector and an emitter of said bipolar transistor being connected to a first power supply terminal, and the other of said collector and said emitter of said bipolar transistor being connected to a second power supply terminal through a diode located to said second power supply terminal; and
    a variable-gain amplifying circuit part having an amplifying circuit having an input coupled to an input terminal for receiving an input signal and an output connected to an output terminal, the other of said collector and said emitter of said bipolar transistor connected to said second power supply terminal through said diode and being connected through a DC blocking capacitor to said input of said amplifying circuit, wherein said first power supply terminal is connected to ground and said second power supply terminal is a positive power supply voltage terminal, said emitter of said bipolar transistor being connected to said ground, and said collector of said bipolar transistor being connected to said positive power supply voltage terminal through said diode connected in such a manner that an anode of said diode is connected to said positive power supply voltage terminal and a cathode of said diode is connected to said collector of said bipolar transistor, and wherein said input of said amplifying circuit is connected through said DC blocking capacitor to said input terminal, and said collector of said bipolar transistor is connected to a node between said DC blocking capacitor and said input terminal, and wherein the diode is located in a forward direction when an anode of the diode assumes a higher potential than the cathode.

6. A variable-gain amplifier circuit claimed in claim 5 wherein a resistor is connected in series with said diode between said collector of said bipolar transistor and said positive power supply voltage terminal.

7. A variable-gain amplifier circuit comprising:

an adjustable impedance circuit part including a bipolar transistor having a base connected to a control terminal for receiving a controlled bias voltage, one of a collector and an emitter of said bipolar transistor being connected to a first power supply terminal, and the other of said collector and said emitter of said bipolar transistor being connected to a second power supply terminal through a diode located to said second power supply terminal; and a variable-gain amplifying circuit part having an amplifying circuit having an input coupled to an input terminal for receiving an input signal and an output connected to an output terminal, the other of said collector and said emitter of said bipolar transistor connected to said second power supply terminal through said diode and being connected through a DC blocking capacitor to said input of said amplifying circuit, wherein said first power supply terminal is a positive power supply voltage terminal and said second power supply terminal is ground, said collector of said bipolar transistor being connected to said positive power supply voltage terminal, and said emitter of said bipolar transistor being connected to said ground through said diode connected in such a manner that an anode of said diode is connected to said emitter of said transistor and a cathode of said diode is connected to said ground, and wherein said input of said amplifying circuit is connected directly to said input terminal, and said emitter of said bipolar transistor is connected through said DC blocking capacitor to said input of said amplifying circuit, and wherein the diode is located in a forward direction when an anode of the diode assumes a higher potential than the cathode.

8. A variable-gain amplifier circuit claimed in claim 7 wherein a resistor is connected in series with said diode between said emitter of said bipolar transistor and said ground.

9. A variable-gain amplifier circuit comprising:

an adjustable impedance circuit part including a bipolar transistor having a base connected to a control terminal for receiving a controlled bias voltage, one of a collector and an emitter of said bipolar transistor being connected to a first power supply terminal, and the other of said collector and said emitter of said bipolar transistor being connected to a second power supply terminal through a diode located to said second power supply terminal; and a variable-gain amplifying circuit part having an amplifying circuit having an input coupled to an input terminal for receiving an input signal and an output connected to an output terminal, the other of said collector and said emitter of said bipolar transistor connected to said second power supply terminal through said diode and being connected through a DC blocking capacitor to said input of said amplifying circuit, wherein said first power supply terminal is connected to ground and said second power supply terminal is a positive power supply voltage terminal, said emitter of said bipolar transistor being connected to said ground, and said collector of said bipolar transistor being connected to said positive power supply voltage terminal through said diode connected in such a manner that an anode of said diode is connected to said positive power supply voltage terminal and a cathode of said diode is connected to said collector of said bipolar transistor, and wherein said input of said amplifying circuit is connected directly to said input terminal, and said collector of said bipolar transistor is connected through said DC blocking capacitor to said input of said amplifying circuit, wherein the diode is located in a forward direction when an anode of the diode assumes a higher potential than the cathode.

10. A variable-gain amplifier circuit claimed in claim 9 wherein a resistor is connected in series with said diode between said collector of said bipolar transistor and said positive power supply voltage terminal.

11. A variable-gain amplifier circuit comprising:

a bipolar transistor having a base connected to a control terminal for receiving a controlled bias voltage, one of a collector and an emitter of said bipolar transistor being connected to a first power supply terminal, and the other of said collector and said emitter of said bipolar transistor being connected to a second power supply terminal through a diode located in a forward direction to said second power supply terminal, an amplifying circuit having an input coupled to an input terminal for receiving an input signal and an output connected to an output terminal, wherein the diode is located in a forward direction when an anode of the diode assumes a higher potential than the cathode, wherein a connection point between said bipolar transistor and said diode is connected through a DC blocking capacitor to said input of said amplifying circuit, and wherein by controlling said controlled bias voltage applied to said base of said transistor, it is possible to adjust a gain of the variable-gain amplifier circuit, and at the same time, it is possible to allow said amplifying circuit having a high S/N ratio, to operate under a low power supply voltage with a low noise factor.

12. A variable-gain amplifier circuit claimed in claim 11 wherein a resistor is connected in series with said diode between the other of said collector and said emitter of said bipolar transistor and said second power supply terminal.

13. A variable-gain amplifier circuit comprising:
an adjustable impedance circuit part including a bipolar transistor having a base connected to a control terminal for receiving a controlled bias voltage, one of a collector and an emitter of said bipolar transistor being connected to a first power supply terminal, and the other of said collector and said emitter of said bipolar transistor being connected to a second power supply terminal through a diode located in a forward direction to said second power supply terminal,
a variable-gain amplifying circuit part having an amplifying circuit having an input coupled to an input terminal for receiving an input signal and an output connected to an output terminal,
the other of said collector and said emitter of said bipolar transistor connected to said second power supply terminal through said diode and being connected through a DC blocking capacitor to said input of said amplifying circuit,
wherein the diode is located in a forward direction when an anode of the diode assumes a higher potential than the cathode,
wherein by controlling said controlled bias voltage applied to said base of said transistor, it is possible to adjust a gain of the variable-gain amplifier circuit, and at the same time, it is possible to allow said amplifying circuit having a high S/N ratio, to operate under a low power supply voltage with a low noise factor,
wherein said first power supply terminal is a positive power supply voltage terminal and said second power supply terminal is connected to ground, said collector of said bipolar transistor being connected to said positive power supply voltage terminal, and said emitter of said bipolar transistor being connected to said ground through said diode connected in such a manner that an anode of said diode is connected to said emitter of said transistor and a cathode of said diode is connected to said ground, and wherein said input of said amplifying circuit is connected through said DC blocking capacitor to said input terminal, and said emitter of said bipolar transistor is connected to a node between said DC blocking capacitor and said input terminal.

14. A variable-gain amplifier circuit claimed in claim 13 wherein a resistor is connected in series with said diode between said emitter of said bipolar transistor and said ground.

15. A variable-gain amplifier circuit comprising:
a bipolar transistor having a base connected to a control terminal for receiving a controlled bias voltage, one of a collector and an emitter of said bipolar transistor being connected to a first power supply terminal, and the other of said collector and said emitter of said bipolar transistor being connected to a second power supply terminal through a diode located in a forward direction to said second power supply terminal,
an amplifying circuit having an input coupled to an input terminal for receiving an input signal and an output connected to an output terminal,
the other of said collector and said emitter of said bipolar transistor connected to said second power supply terminal through said diode and being connected through a DC blocking capacitor to said input of said amplifying circuit,
wherein the diode is located in a forward direction when an anode of the diode assumes a higher potential than the cathode,
wherein by controlling said controlled bias voltage applied to said base of said transistor, it is possible to adjust a gain of the variable-gain amplifier circuit, and at the same time, it is possible to allow said amplifying circuit having a high S/N ratio, to operate under a low power supply voltage with a low noise factor,
wherein said first power supply terminal is connected to ground and said second power supply terminal is a positive power supply voltage terminal, said emitter of said bipolar transistor being connected to said ground, and said collector of said bipolar transistor being connected to said positive power supply voltage terminal through said diode connected in such a manner that an anode of said diode is connected to said positive power supply voltage terminal and a cathode of said diode is connected to said collector of said bipolar transistor, and wherein said input of said amplifying circuit is connected through said DC blocking capacitor to said input terminal, and said collector of said bipolar transistor is connected to a node between said DC blocking capacitor and said input terminal.

16. A variable-gain amplifier circuit claimed in claim 15 wherein a resistor is connected in series with said diode between said collector of said bipolar transistor and said positive power supply voltage terminal.

17. A variable-gain amplifier circuit comprising:
a bipolar transistor having a base connected to a control terminal for receiving a controlled bias one of a collector and an emitter of said bipolar transistor being connected to a first power supply terminal, and the other of said collector and said emitter of said bipolar transistor being connected to a second power supply terminal through a diode located in a forward direction to said second power supply terminal,
an amplifying circuit having an input coupled to an input terminal for receiving an input signal and an output connected to an output terminal,
the other of said collector and said emitter of said bipolar transistor connected to said second power supply terminal through said diode and being connected through a DC blocking capacitor to said input of said amplifying circuit,
wherein the diode is located in a forward direction when an anode of the diode assumes a higher potential than the cathode,
wherein by controlling said controlled bias voltage applied to said base of said transistor, it is possible to adjust a gain of the variable-gain amplifier circuit, and at the same time, it is possible to allow said amplifying circuit having a high S/N ratio, to operate under a low power supply voltage with a low noise factor,
wherein said first power supply terminal is a positive power supply voltage terminal and said second power supply terminal is ground, said collector of said bipolar transistor being connected to said positive power supply voltage terminal, and said emitter of said bipolar transistor being connected to said ground through said diode connected in such a manner that an anode of said diode is connected to said emitter of said transistor and a cathode of said diode is connected to said ground, and wherein said input of said amplifying circuit is connected directly to said input terminal, and said emitter of said bipolar transistor is connected through said DC blocking capacitor to said input of said amplifying circuit.

18. A variable-gain amplifier circuit claimed in claim 17 wherein a resistor is connected in series with said diode between said emitter of said bipolar transistor and said ground.

19. A variable-gain amplifier circuit comprising:
- a bipolar transistor having a base connected to a control terminal for receiving a controlled bias voltage, one of a collector and an emitter of said bipolar transistor being connected to a first power supply terminal, and the other of said collector and said emitter of said bipolar transistor being connected to a second power supply terminal through a diode located in a forward direction to said second power supply terminal,
- an amplifying circuit having an input coupled to an input terminal for receiving an input signal and an output connected to an output terminal,
- the other of said collector and said emitter of said bipolar transistor connected to said second power supply terminal through said diode and being connected through a DC blocking capacitor to said input of said amplifying circuit,
- wherein the diode is located in a forward direction when an anode of the diode assumes a higher potential than the cathode,
- wherein by controlling said controlled bias voltage applied to said base of said transistor, it is possible to adjust a gain of the variable-gain amplifier circuit, and at the same time, it is possible to allow said amplifying circuit having a high S/N ratio, to operate under a low power supply voltage with a low noise factor,
- wherein said first power supply terminal is connected to ground and said second power supply terminal is a positive power supply voltage terminal, said emitter of said bipolar transistor being connected to said ground, and said collector of said bipolar transistor being connected to said positive power supply voltage terminal through said diode connected in such a manner that an anode of said diode is connected to said positive power supply voltage terminal and a cathode of said diode is connected to said collector of said bipolar transistor, and wherein said input of said amplifying circuit is connected directly to said input terminal, and said collector of said bipolar transistor is connected through said DC blocking capacitor to said input of said amplifying circuit.

20. A variable-gain amplifier circuit claimed in claim 19 wherein a resistor is connected in series with said diode between said collector of said bipolar transistor and said positive power supply voltage terminal.

21. A variable-gain amplifier circuit comprising:
- an adjustable impedance circuit part including a bipolar transistor having a base connected to a control terminal for receiving a controlled bias voltage, an emitter of said bipolar transistor being connected to ground, and a collector of said bipolar transistor being connected to a cathode of a diode having an anode connected to a positive power supply terminal; and
- a variable-gain amplifying circuit part having an amplifying circuit having an input coupled through a DC blocking capacitor to an input terminal for receiving an input signal and an output connected to an output terminal,
- a connection point between said collector of said bipolar transistor and said cathode of said diode being connected to a connection node between said DC blocking capacitor and said input terminal.

22. A variable-gain amplifier circuit claimed in claim 21 wherein a resistor is connected in series with said diode between said positive power supply terminal and said connection node between said collector of said bipolar transistor, said DC blocking capacitor and said input terminal.

* * * * *

UNITED STATES PATENT AND TRADEMARK OFFICE
CERTIFICATE OF CORRECTION

PATENT NO. : 6,639,469 B2
DATED : October 28, 2003
INVENTOR(S) : Aoki

It is certified that error appears in the above-identified patent and that said Letters Patent is hereby corrected as shown below:

<u>Column 16,</u>
Line 30, "controlled bias one of" should be -- controlled bias voltage, one of --.

Signed and Sealed this

Second Day of March, 2004

JON W. DUDAS
*Acting Director of the United States Patent and Trademark Office*